United States Patent [19]

Fuse et al.

[11] Patent Number: 4,989,540

[45] Date of Patent: Feb. 5, 1991

[54] APPARATUS FOR REACTION TREATMENT

[75] Inventors: Noboru Fuse, Yokohama; Hirofumi Kitayama, Kanagawa, both of Japan

[73] Assignee: Tel Sagami Limited, Kanagawa, Japan

[21] Appl. No.: 392,597

[22] Filed: Aug. 11, 1989

[30] Foreign Application Priority Data

Aug. 17, 1988 [JP] Japan .................. 63-204447

[51] Int. Cl.⁵ ............................................. C23C 16/00
[52] U.S. Cl. ..................................... 118/719; 118/715; 118/724; 118/725; 118/730; 156/345; 156/646
[58] Field of Search ............... 118/715, 719, 724, 725, 118/730; 156/345, 646

[56] References Cited

U.S. PATENT DOCUMENTS 4,430,149  2/1984  Berkman .......................... 118/719

FOREIGN PATENT DOCUMENTS 53-52356   5/1978  Japan .
61-176113  8/1986  Japan .
62-244123 10/1987  Japan .................... 118/730
62-245626 10/1987  Japan .................... 118/715

*Primary Examiner*—Norman Morgenstern
*Assistant Examiner*—Terry J. Owens
*Attorney, Agent, or Firm*—Oblon, Spivak, McClelland, Maier & Neustadt

[57] ABSTRACT

A treatment apparatus used in manufacturing processes for semiconductor devices and the like, in which substrates are treated by means of a reaction gas. An inner tube, which is coaxially disposed in a reaction tube, defines a reaction region surrounding the substrates to be treated. The inner tube has a number of perforations in its wall, by means of which the inside and outside of the reaction region communicate with each other. During reaction treatment, the reaction gas is supplied to the reaction region, while a cleaning gas is supplied to the region outside the reaction region. Both these gases are discharged through a common exhaust pipe. The flows of the reaction gas and the cleaning gas are controlled so that the pressure inside the reaction region is higher than the pressure outside the region. As the cleaning gas is supplied, production and adhesion of reaction compound particles on the inner surface of the reaction tube is prevented.

11 Claims, 3 Drawing Sheets

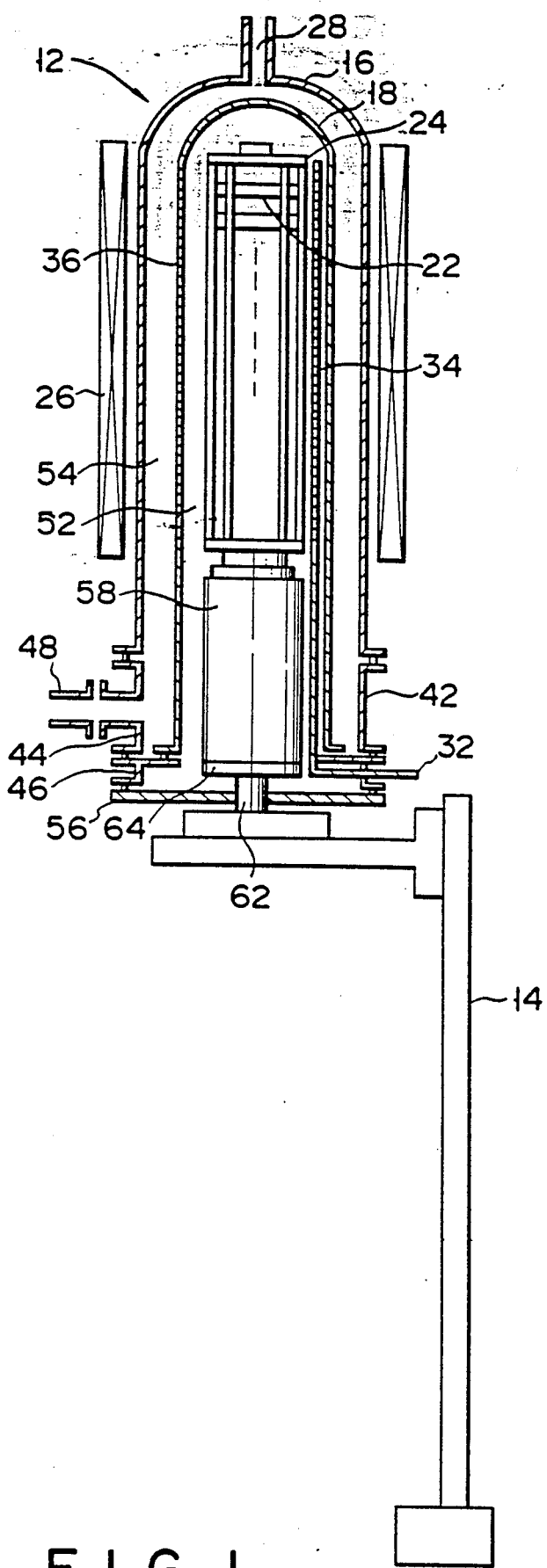
F I G. 1

APPARATUS FOR REACTION TREATMENT

BACKGROUND OF THE INVENTION

1. Field of the Invention

The present invention relates to an apparatus and a method for treating wafer substrates and the like by means of a reaction was, used in processes for manufacturing semiconductor devices, circuit boards for driving liquid crystals, etc., and more particularly, to an apparatus and a method of this type provided with a mechanism for reducing the amount of compounds adhering to the inner surface of a reaction vessel.

2. Description of the Related Art

Treatment apparatuses are widely used in processes for manufacturing semiconductor devices, circuit boards for driving liquid crystals, etc. In these apparatuses, a reaction gas is caused to flow into a reaction vessel in order to subject objects to be treated, such as wafers and circuit boards, to various treatments, including film formation, diffusion, oxidation, etching, etc.

According to these conventional apparatuses, however, a compound of the same composition as a target product may possibly adhere to the inner surface of the reaction vessel. The compound on the inner surface of the vessel may react again during chemical reaction of the product, so that it chemically contaminates the desired product, or is entrapped in the form of particulates in the product, thereby considerably reducing the quality of the product.

If excitation energy is externally supplied to hasten the chemical reaction, the compound on the vessel absorbs or reflects the energy necessary for the reaction. Accordingly, constant energy cannot be supplied to the objects to be treated in the vessel, so that it is hard to control the chemical reaction accurately.

In a conventional decompression CVD apparatus, for example, a silicon oxide film (e.g., $SiO_2$) is formed in the following manner. First, a quartz-glass boat, which carries a plurality of wafers in regular arrangement, is inserted into a cylindrical quartz-glass reaction tube surrounded by a heating device, such as a resistance heater, through an open end of the tube. Thus, the boat is situated in a predetermined position in the reaction tube. Then, after the open end of the tube is closed airtight by means of, e.g., a disk-shaped stainlesssteel lid, the gases inside the reaction tube are exhausted to a predetermined pressure level. The inside of the reaction tube is kept at a temperature of, e.g., 700° C. by means of the heater, and reaction gases, including silicon tetrachloride ($SiCl_4$), oxygen ($O_2$), etc., are mixedly introduced into the reaction tube, and also subjected to heat treatment.

If the aforesaid reaction is repeated, however, a considerable amount of silicon oxide particles adhere to the inner surface of the reaction tube, especially that portion of the inner surface near the region for the introduction of the reaction gas. Accordingly, the floating oxide particles adhere to the wafer surface, and foreign matter contaminates the silicon oxide film. If a contamination layer formed of the reaction compound, such as the oxide particles on the inner surface of the reaction tube, becomes thicker, the transmission of radiant heat, as a factor of energy supply from the heating device, is reduced, and the distribution of temperature inside the reaction tube deteriorates. Conventionally, therefore, the reaction tube with the compound thereon is periodically cleaned. This cleaning work requires processes for taking out the reaction tube from the CVD apparatus, removing or washing out the adhering compound by means of an exclusive-use cleaning machine, using hydrofluoric acid and pure water, drying the tube by means of a drying machine, attaching the cleaned reaction tube again to the apparatus, and effecting adjustment work. The cleaning process involves the removal and attachment of the reaction tube, and assembly and disassembly of a vacuum exhaust system, especially in the case of the decompression CVD apparatus, thus requiring much time and labor. Since the operation of the apparatus must be stopped during such work, moreover, the operating efficiency of the apparatus is lowered.

Disclosed in Japanese Patent Disclosure No. 53-52356 is a method in which an etching gas is caused to flow in a layer along the inner surface of a reaction tube, or a reaction gas is doped with a suitable amount of etching gas, thereby reducing deposition of an undesired reaction compound on the inner surface of the reaction tube. According to this method, however, the etching gas freely enters into a reaction region for substrates to be treated, thus adversely affecting the desired reaction on the substrates, in both physical and chemical aspects.

Disclosed in Japanese Patent Disclosure No. 61-176113 is a method in which an etching gas or solution, pure water, etc., are introduced successively into a reaction tube after heat treatment, and the tube is cleaned inside the housing of the heat treatment apparatus. According to this method, however, large-scale equipment for all of the cleaning processes must be attached to the treatment apparatus. Thus, the apparatus requires increased installation space and entails increased costs. Since the operation of the apparatus is stopped during the prolonged cleaning work, moreover, the operating efficiency is lowered. In view of the management of a solvent or pure water, furthermore, the wet cleaning may produce a new source of contamination if it is applied to the manufacture of VLSIs.

Summary of the Invention

Accordingly, an object of the present invention is to provide an apparatus and a method for reaction treatment with a mechanism which can restrain a compound from being deposited on the inner surface of a reaction tube or reaction vessel, without adversely affecting the desired reaction on substrates to be treated.

Another object of the present invention is to provide an apparatus and a method for reaction treatment with a mechanism which can eliminate deposition of a compound on the inner surface of the reaction vessel, without lowering the operating efficiency of the apparatus.

In order to achieve the above objects, a treatment apparatus according to the present invention, which performs reaction treatment of an object by causing a reaction gas to flow into a reaction vessel, comprises: division means removably disposed in the reaction tube and dividing the inside of the reaction tube into at least first and second spaces, the first space including a reaction region holding the object of treatment; means for allowing the reaction region to communicate with the second space, inside the reaction vessel; reaction gas supply means for supplying the reaction gas to the reaction region; cleaning gas supply means for supplying a cleaning gas to the second space inside the reaction vessel; and exhaust means connected to the reaction vessel and adapted to discharge the gas flowing through the second space.

With this arrangement, production and adhesion of the reaction compound on the inner surface of the reaction tube can be prevented by the supply of the cleaning gas.

The cleaning gas may be an inert gas or a gas which can dissolve the compound produced during the reaction treatment. If the cleaning gas is a dissolvent gas, it prevents the production and adhesion of the compound by means of chemical and physical actions. The chemical action is a chemical dissolution of the compound, while the physical action is prevention of stagnation of the gas on the wall surface of the reaction tube. If the cleaning gas is an inert gas, it prevents the production and adhesion of the compound by means of physical action.

In the conventional heat treatment apparatus, the reaction vessel is formed of a cylindrical reaction tube, and the division means is formed of an inner tube disposed in the reaction tube so as to be coaxial therewith. In this case, the communication means is formed of a number of perforations bored through the wall of the inner tube and/or an end opening of the inner tube.

If the reaction tube has a vertical longitudinal axis, and if the end portion of the inner tube is capped, the cleaning gas supply means and the exhaust means are connected to the top and bottom portions, respectively, of the reaction tube.

Alternatively, the division means may be formed of a first inner tube having an open end portion so that a second inner tube having an open end portion is disposed between the reaction tube and the first inner tube so as to be coaxial therewith. In this case, the cleaning gas supply means is connected to a gap between the first and second inner tubes, and the exhaust means is connected to a gap between the second inner tube and the reaction tube.

A reaction treatment method according to the present invention, in which at least first and second spaces are defined in a reaction vessel so that an object of treatment is held in the first space, comprises: a process for supplying a reaction gas to a reaction region inside the first space; a process for discharging the reaction gas which has been used in the treatment of the object into the second space; a process for supplying a cleaning gas to at least that portion of the second space which serves as a passage for the reaction gas, at least while the reaction gas is flowing; and a process for discharging the cleaning gas and the reaction gas.

The above and other features and advantages of the present invention will be more apparent from the following detailed description taken in connection with the accompanying drawings.

BRIEF DESCRIPTION OF THE DRAWINGS

FIG. 1 is a longitudinal front view of a vertical-type CVD apparatus as a treatment apparatus according to an embodiment of the present invention;

DETAILED DESCRIPTION OF THE PREFERRED EMBODIMENTS

Figure 2:
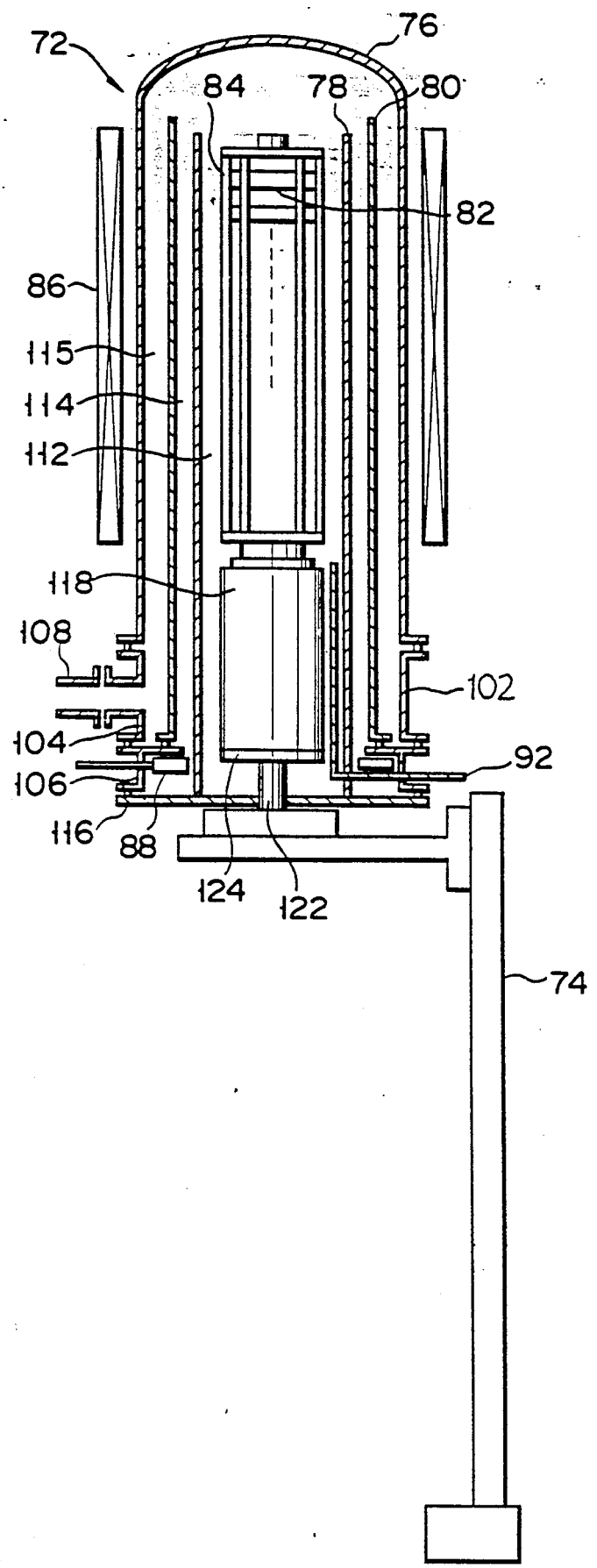
FIG. 2 is a longitudinal front view of a vertical-type CVD apparatus as another treatment apparatus according to another embodiment of the invention.

As shown in FIG. 1, a vertical-type decompression CVD apparatus according to an embodiment of the present invention comprises treatment section 12 and lift mechanism 14. Section 12 includes a reaction vessel, e.g., cylindrical reaction tube 16, which has a vertical longitudinal axis. Mechanism 14 is used to load and unload boat 24 into and from tube 16. Boat 24 carries a plurality of objects to be treated, e.g., semiconductor wafer substrates 22, vertically arranged at regular intervals.

Inner tube 18 is disposed in reaction tube 16. Both these tubes ar formed of such a material as quartz, which is heat-resistant and cannot easily react to a reaction gas. Inner tube 18, which is in the form of a hollow cylinder having an arcuate cap at the top, is located uncontacted inside reaction tube 16. A space of a predetermined width, e.g., 15 mm, is kept between the inner surface of tube 16 and the outer surface of tube 18.

Gas supply port 28 is connected to the upper end portion of reaction tube 16. Besides the reaction gas, a cleaning gas, selected from various gases including etching gases, such as hydrogen chloride (HCl), and inert gases, such as nitrogen ($N_2$), argon (Ar), etc., is introduced into tube 16 through port 28. Cylindrical heating mechanism 26 is coaxially disposed around tube 16. It is a resistance heater in the form of a coil, for example. Heater 26, which is connected to an AC power source (not shown), can uniformly heat the region for substrates 22 to be treated to a desired temperature.

Gas supply pipe 32 for the supply of a specified reaction gas, such as monosilane ($SiH_4$), into inner tube 18 is disposed in tube 18. Tube 32 is connected to a gas source by means of a mass-flow controller or the like. The gas supply pipe penetrates manifold 42, and then vertically extends along the inner surface of inner tube 18 to the top surface thereof. A number of gas jets 34 for ejecting the reaction gas are bored through tube 32 so as to be arranged at regular intervals in the longitudinal direction of tube 32. A number of perforations 36 through which the reaction gas is discharged are formed at those positions of the wall of inner tube 18 which face jets 34. Perforations 36 of tube 18 are situated corresponding individually to jets 34 of tube 32, and are arranged at intervals so as to cover substantially half or four fifths of the circumference of the side wall of tube 18. The region for perforations 36 is selected within a region such that the reaction gas from gas jets 34 can diffuse uniformly over the whole under surface of each wafer. By combining jets 34 of gas supply pipe 32 and perforations 36 of inner tube 18, a flow of the reaction gas parallel to the treatment surfaces of substrates 22 can be formed when the substrates are set in large numbers in tube 18.

Ring-shaped manifold 42 of stainless steel is removably attached to the lower end portion of reaction tube 16. Gap 54 between reaction tube 16 and inner tube 18 is closed by the manifold. Manifold 42 includes upper and lower parts 44 and 46 which are used to retain tubes 16 and 18, respectively. Lower part 46 also serves to facilitate the attachment and detachment of the inner tube at times of maintenance or assembling. Junctions between tubes 16 and 18 and upper and lower parts 44 and 46 of manifold 42 are kept airtight by means of sealing members, e.g., O-rings, individually. Exhaust pipe 48 is connected to upper part 44 of manifold 42, whereby the gas passed through perforations 36 of inner tube 18 after treatment and the cleaning gas flowing through gap 54 are discharged. Pipe 48 is also connected to a vacuum pump (not shown) which can reduce the pressure inside reaction tube 16 to a desired level, and discharge the reaction gas and the like.

Gap 54 between reaction tube 16 and inner tube 18 is divided from reaction region 52 by means of tube 18, and forms an exhaust passage which connects perforations 36 in the side wall of tube 18 and exhaust pipe 48 of manifold 42. Thus, gap or passage 54 serves as a common gas passage for the cleaning gas, such as hydrogen chloride, introduced through gas supply port 28 and the reacted gas, such as monosilane, supplied from gas supply pipe 32. Each perforation 36 in the side wall of inner tube 18 is made much smaller than the sectional passage area of gap 54, which forms the gas passage, lest the gas flowing through the gas passage flow into reaction region 52 for the substrates, or the inside space of inner tube 18. Also, the flows of the reaction gas and the cleaning gas are controlled so that the pressure on the side of reaction region 52 is higher than the pressure on the side of exhaust passage 54.

Planar lid 56 of stainless steel is disposed so that it can engage the lower end of manifold 42, to make the inside space of reaction tube 16 an airtight treatment chamber, as lift mechanism 14 rises. Boat 24 for carrying substrates 22 is supported above lid 56. It can be situated at a predetermined height inside reaction tube 16. Heat retaining cylinder 58 is disposed between boat 24 and lid 56, whereby heat is prevented from escaping from the reaction tube. Boat 24 is formed of a heat-resistant material which is nonreactive to the reaction gas, for example, quartz glass. A plurality of substrates 22, e.g., about 100 to 150 in number, can be arranged at regular intervals of, e.g., 3 mm on boat 24.

A boat rotating mechanism, which is mounted on lid 56, can rotate substrates 22 on boat 24 around the vertical axis of reaction tube 16 during treatment. This rotation of substrates 22 is intended to improve the uniformity of temperature and gas distribution for the substrates, and contributes uniform formation of a thin film on each substrate. The rotation mechanism includes a drive motor (not shown) located below lid 56, and rotating shaft 62 engaged with the motor vertically extends through the center of lid 56 into reaction tube 16. Shaft 62 is connected to support 64, made of ceramics or the like, at the bottom portion of heat retaining cylinder 58, and supports cylinder 58 and boat 24.

The following is a description of the operation of the vertical-type CVD apparatus with the aforementioned construction.

First, a desired number of substrates 22 are loaded onto boat 24 in the aforesaid state by means of a substrate transfer device (not shown). Boat 24 is automatically set on heat retaining cylinder 58 over lid 56, which is lowered to a down position by means of lift mechanism 14. The set boat is raised for a predetermined distance by mechanism 14, so that it is carried into a predetermined position inside reaction tube 16, without coming into contact with the inner surface of inner tube 18. As manifold 42 at the lower portion of the reaction tube then engages lid 56, boat 24 is automatically positioned, and an airtight reaction space is formed. Subsequently, the vacuum pump (not shown), which is linked to reaction tube 16, is operated so that the inside of tube 16 is kept at a desired low pressure, e.g., 1 to 5 torr, and a voltage previously applied to heater 26 keeps the heater adjusted to a desired temperature, e.g., 600 to 1,200° C.

After this desired condition is established, the flow rate is adjusted to about 500 SCCM by means of the mass-flow controller or the like, and the reaction gas, e.g., silane ($SiH_4$) or dichlorosilane ($SiH_2Cl_2$), is supplied to reaction region 52 for a predetermined period of time. Thereupon, the reaction gas, introduced through gas jets 34 of gas supply pipe 32, advances toward perforations 36 of inner tube 18, producing a substantially uniform gas flow parallel to the substrate surface. After passing through perforations 36, the reaction gas flows through gap 54 or the exhaust passage, and is then discharged through exhaust pipe 48.

Preferably, the cleaning gas should be supplied so as to be in contact with the inner wall surface of gap 54. Also, the cleaning gas must be supplied at least to the passage for the reaction gas, and need not be caused to flow through the region where the reaction gas does not diffuse out from inner pipe 18.

While the reaction gas is being supplied, hydrogen chloride, for use as the etching gas, is supplied through supply port 28 at the top portion of reaction tube 16, also at a flow rate of about 500 SCCM, in order to prevent or reduce adhesion of a reaction compound to the inner surface of reaction tube 16 and the outer surface of inner tube 18. At this time, the pressure inside tube 18 or on the side of reaction region 52 is always kept higher than the pressure outside tube 18 or on the side of gap 54. As the flows of the reaction gas and the cleaning gas are controlled in this manner, the gas on the gap side is prevented from flowing back to the reaction region side. Thus, production and adhesion of the reaction compound on the inner surface of reaction tube 16 and the outer surface of inner tube 18 can be prevented simultaneously with an expected reaction in reaction region 52, without adversely affecting the desired reaction on substrates 22.

If the cleaning gas is a gas such as an etching gas, which can dissolve the compound produced during the reaction treatment, it prevents the production and adhesion of the compound by means of chemical and physical actions. The chemical action is a chemical dissolution of the compound, while the physical action is prevention of stagnation of the gas on the wall surface of reaction tube 16. If the cleaning gas is an inert gas, it prevents the production and adhesion of the compound by means of the physical action.

Since the expected reaction or film formation is made simultaneously with the removal of the reaction compound in the exhaust gas, as described above, very few particles are produced during the treatment. The production and adhesion of the reaction compound on the inner surface of reaction tube 16 and the outer surface of inner tube 18 are considerably reduced. Thus, an expected thin film of fine quality can be formed without entailing disturbance of the temperature control in reaction region 52 by radiant heat or the like.

After the CVD treatment, the supply of the reaction gas and the cleaning gas is stopped, and an inert gas, such as nitrogen, is introduced into reaction tube 16, so that the gas inside tube 16 is exhausted and replaced to restore the atmospheric pressure. Then, lid 56 is removed, and boat 24, carrying substrates 22 thereon, is lowered by means of lift mechanism 14, whereupon the treatment is finished.

Inner tube 18 must sometimes be taken out of the treatment apparatus to be cleaned, depending on the degree of contamination of its inner surface. In such a case, only tube 18 must be replaced without removing reaction tube 16 from the apparatus. Accordingly, the cleaning process is simple, and the operating efficiency of the treatment apparatus cannot be lowered by replacement work.

FIG. 2 shows a vertical-type CVD apparatus according to a second embodiment of the present invention. This apparatus also comprises treatment section 72 and lift mechanism 74. Section 72 includes reaction vessel, e.g., cylindrical reaction tube 76, which has a vertical longitudinal axis. Mechanism 74 is used to load and unload boat 84 into and from tube 76. Boat 84 carries a plurality of objects of treatment, e.g., semiconductor wafer substrates 82, vertically arranged at regular intervals.

First and second inner tubes 78 and 80 are disposed in reaction tube 76. These tubes are formed of such a material as quartz, which is heat-resistant and cannot easily react to a reaction gas. Inner tubes 78 and 80 are each in the form of an open-topped hollow cylinder. First tube 78 is located uncontacted inside second tube 80, which is disposed uncontacted inside reaction tube 76.

Cylindrical heating mechanism 86 is coaxially disposed around reaction tube 76. It is a resistance heater in the form of a coil, for example. Heater 86, which is connected to an AC power source (not shown), can uniformly heat the region for substrates 82 to be treated to a desired temperature.

Ring-shaped manifold 102 of stainless steel is removably attached to the lower end portion of reaction tube 76. Gap 115 between the reaction tube and second inner tube 80 is closed by the manifold. Manifold 102 includes upper and lower parts 104 and 106 which are used to retain tubes 76 and 80, respectively. Lower part 106 also serves to facilitate the attachment and detachment of the second inner tube at the time of maintenance or assembling. Junctions between tubes 76 and 80 and upper and lower parts 104 and 106 of manifold 102 are kept airtight by means of sealing members, e.g., O-rings, individually. Exhaust pipe 108 is connected to upper part 104 of manifold 102, and also to a vacuum pump (not shown) which can reduce the pressure inside reaction tube 76 to a desired level, and discharge the reaction gas and the like.

Planar lid 116 of stainless steel is disposed so that it can engage the lower end of manifold 102, to make the inside space of reaction tube 76 an airtight treatment chamber, as lift mechanism 74 rises. Boat 84 for carrying substrates 82 is supported above lid 116. It can be situated at a predetermined height inside reaction tube 76. Heat retaining cylinder 118 is disposed between boat 84 and lid 116, whereby heat is prevented from escaping from the reaction tube. Boat 84 is formed of a heat-resisting material which is nonreactive to the reaction gas, for example, quartz glass. A plurality of substrates 82, e.g., about 100 to 150 in number, can be arranged at regular intervals of, e.g., 3 mm on boat 84.

A boat rotating mechanism, which is mounted on lid 116, can rotate substrates 82 on boat 84 around the vertical axis of reaction tube 76 during treatment. This rotation of substrates 82 is intended to improve the uniformity of temperature and gas distribution for the substrates, and contributes uniform formation of a thin film on each substrate. The rotation mechanism includes a drive motor (not shown) located below lid 116, and rotating shaft 122 in engagement with the motor vertically extends through the center of lid 116 into reaction tube 76. Shaft 122 is connected to support 124, made of ceramics or the like, at the bottom portion of heat retaining cylinder 118, and supports cylinder 118 and boat 84.

Figure 4A:
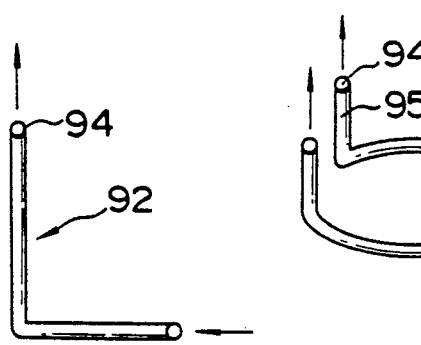
FIGS. 4A, 4B and 4C are perspective views showing various examples of reaction gas supply pipes adapted for use in the apparatus shown in FIG. 2.
Figure 4B:
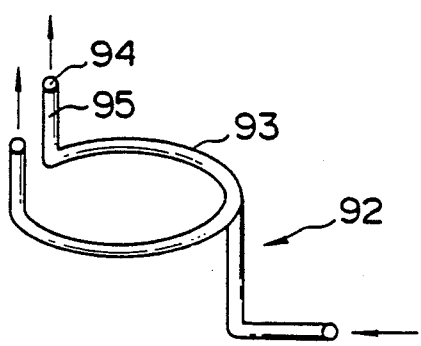
Figure 4C:
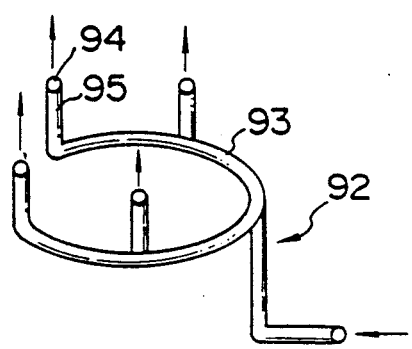

Gas supply pipe 92 for introducing the reaction gas into reaction region 112 penetrates lower part 106 of manifold 102. Pipe 92 vertically extends along the inner surface of first inner tube 78 so that its top end is situated substantially at the same height as the bottom face of boat 84. FIGS. 4A to 4C show various examples of the reaction gas supply pipe. If the supply pipe is to have one jet 94, it is formed of a single pipe bent at right angles, as shown in FIG. 4A. If the supply pipe is to have two or four jets 94, nozzles 95, the same in number as the jets, are formed protruding from ring pipe portion 93, as shown in FIG. 4B or 4C.

Figure 3:
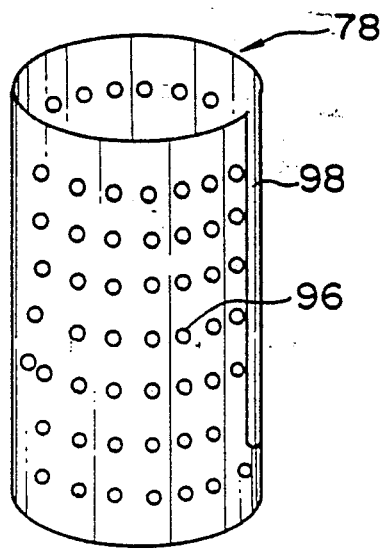
FIG. 3 is a perspective view of a first inner tube used in the apparatus shown in FIG. 2.

First inner tube 78 is mounted on lid 116, and can be inserted together with boat 84. FIG. 3 shows an example of first inner tube 78, which is formed of a hollow cylinder having a number of perforations 96 through which the reaction gas introduced from gas supply pipe 92 is delivered to the side of first gap 114 between the first and second inner tubes. Perforations 96 are arranged at intervals so as to cover substantially the whole circumference of the side wall of tube 78. Some processes do not require the use of these perforations. The peripheral side wall of first inner tube 78 is formed with notch 98 which is adapted to receive gas supply pipe 92 when pipe 78 is inserted into reaction tube 76.

Figure 5:
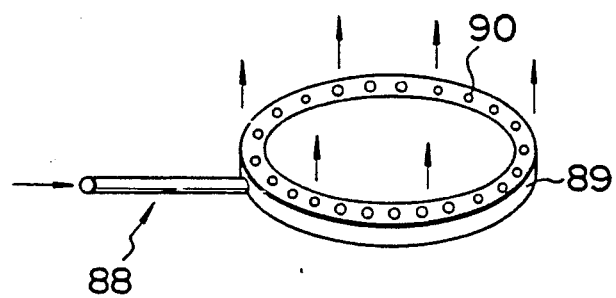
FIG. 5 is a perspective view of a cleaning gas supply pipe used in the apparatus shown in FIG. 2.

Cleaning gas supply member 88 is provided penetrating lower part 106 of manifold 102 so as to be retained by part 106. Jets 90 of supply member 88 face first gap 114, and serve to introduce a cleaning gas, selected from various gases including etching gases, such as hydrogen chloride (HCl), and inert gases, such as nitrogen ($N_2$), argon (Ar), etc. FIG. 5 shows an example of supply member 88, in which hollow ring 89 of stainless steel is mounted on the extreme end of a straight quartz pipe. A plurality of perforations 90 are arranged on the upper surface of ring 89 so that the cleaning gas can be uniformly supplied to first gap 114.

The cleaning gas from supply member 88 rises in first gap 114, and passes through an open space at the upper portion of reaction tube 76. Then, the gas flows downward through second gap 115 between tube 76 and second inner tube 80, and is discharged through exhaust pipe 108 which is connected to manifold 102. The reaction gas supplied to reaction region 112 rises along boat 84. Some of the reaction gas passes through a top end opening of first inner tube 78, while the other flows into first gap 114 through perforations 96 in the side wall of tube 78, and is discharged through the same passage as the cleaning gas. Thus, gaps 114 and 115 form an exhaust passage which connects perforations 96 in the side wall of tube 78 and exhaust pipe 108 of manifold 102. This exhaust passage serves as a common gas passage for the cleaning gas, such as hydrogen chloride, and the reacted gas, such as monosilane. Each perforation 96 in the side wall of first inner tube 78 is made much smaller than the sectional passage area of first gap 114, which forms the gas passage, lest the exhaust gas on the side of first gap 114 flow into reaction region 112 or the inside space of first inner tube 78. Also, the flows of the reaction gas and the cleaning gas are controlled so that the pressure on the side of reaction region 112 is higher than the pressure on the side of exhaust passage 114.

The following is a description of the operation of the vertical-type CVD apparatus according to the second embodiment.

First, a desired number of substrates 82 are loaded onto boat 84 in the aforesaid state by means of a substrate transfer device (not shown). Boat 84 is automatically set on heat retaining cylinder 118 over lid 116, which is lowered to a down position by means of lift mechanism 74. Also, first inner tube 78 is set on lid 116 so as to surround boat 84 without being in contact with it. Thereafter, boat 84 and tube 78 are raised for a predetermined distance by mechanism 74, so that they are carried into a predetermined position inside reaction tube 76 without coming into contact with the inner surface of second inner tube 80. As manifold 102 at the lower portion of the reaction tube then engages lid 116, boat 84 is automatically positioned, and an airtight reaction space is formed. Subsequently, the vacuum pump (not shown), which is linked to reaction tube 76, is operated so that the inside of tube 76 is kept at a desired low pressure, e.g., 1 to 5 torr, and a voltage previously applied to heater 86 keeps the heater adjusted to a desired temperature, e.g., 600 to 1,200° C.

After this desired condition is established, the flow rate is adjusted to about 500 SCCM by means of the mass-flow controller or the like, and the reaction gas, e.g., silane or dichlorosilane, is supplied to reaction region 112 for a predetermined period of time. The reaction gas introduced through jet(s) 94 of gas supply pipe 92 rises along boat 84. Some of the reaction gas passes through the top end opening of first inner tube 78 to reach the upper portion of the inside space of reaction tube 76, while the other flows into first gap 114 through perforations 96 in the side wall of tube 78.

While the reaction gas is being supplied, hydrogen chloride, for use as the etching gas, is supplied from cleaning gas supply member 88 at a flow rate of about 500 SCCM. At this time, the pressure inside first inner tube 78 or on the side of reaction region 112 is always kept higher than the pressure on the side of gaps 114 and 115. As the flows of the reaction gas and the cleaning gas are controlled in this manner, the gas on the gap side is prevented from flowing back to the reaction region side. Thus, production and adhesion of the reaction compound on the inner surface of reaction tube 76, the inner and outer surfaces of second inner tube 80, and the outer surface of first inner tube 78 can be prevented simultaneous with, and without adversely affecting, the desired reaction on substrates 82.

If the cleaning gas is a gas such as an etching gas, which can dissolve the compound produced during the reaction treatment, it prevents the production and adhesion of the compound by means of chemical and physical actions. The chemical action is a chemical dissolution of the compound, while the physical action is prevention of stagnation of the gas on the wall surface of reaction tube 16. If the cleaning gas is an inert gas, it prevents the production and adhesion of the compound by means of the physical action.

Since the expected reaction or film formation is made simultaneously with the removal of the reaction compound in exhaust gas, as described above, very few particles are produced during the treatment. The production and adhesion of the reaction compound on the inner surface of reaction tube 76, and the other surfaces, are considerably reduced. Thus, a desired thin film of fine quality can be formed without entailing disturbance of the temperature control in reaction region 112 by radiant heat or the like.

After the CVD treatment, the supply of the reaction gas and the cleaning gas is stopped, and an inert gas, such as nitrogen, is introduced into reaction tube 76, so that the gas inside tube 76 is exhausted and replaced to be restored to atmospheric pressure. Then, lid 116 is removed, and boat 84, carrying substrates 82 thereon, is lowered by means of lift mechanism 74, whereupon the treatment is finished.

The reaction compound and the like are liable to adhere to the inner surface of first inner tube 78. Since tube 78, along with boat 84, can be taken out of the region for treatment, however, the cleanness of the treatment region can be maintained by replacing tube 78. Since only first inner tube 78 must be cleaned, moreover, the cleaning process is simple, and the operating efficiency of the treatment apparatus cannot be reduced due to the cleaning operation.

Although the present invention has been described in detail in connection with the preferred embodiments illustrated in the accompanying drawings, it is to be understood that the invention is not limited to these embodiments, and that various changes and modifications may be effected therein by one skilled in the art, without departing from the scope or spirit of the invention. For example, the cleaning gas may be caused to flow either continuously or intermittently. Also, plasma generating means may be disposed on the exhaust passage side to produce a plasma etching effect. Although the apparatuses of the aforementioned embodiments are both vertical-type CVD apparatuses, furthermore, the present invention may be applied to apparatuses of any types, including a horizontal type, in which objects of treatment are subjected to reaction treatment using a reaction gas. Further, the CVD apparatuses may be replaced with diffusion furnaces, oxidation furnaces, or plasma treatment furnaces.

What is claimed is:

1. A treatment apparatus which performs reaction treatment of an object by causing a reaction gas to flow into a reaction vessel, comprising:
    division means removably disposed in the reaction vessel and dividing the inside of the reaction vessel into at least first and second spaces, said first space including a reaction region holding the object of treatment;
    means for allowing the reaction region to communicate with the second space, inside the reaction vessel;
    reaction gas supply means for supplying the reaction gas directly to the reaction region;
    cleaning gas supply means for supplying a cleaning gas directly to the second space; and
    exhaust means connected to the reaction vessel and adapted to discharge the gas directly from the second space;
    wherein said reaction gas and said cleaning gas are supplied while the flow of the gases inside the reaction vessel is controlled, so that the pressure inside the reaction region is higher than the pressure inside the second space, during the reaction treatment.

2. The treatment apparatus according to claim 1, wherein said cleaning gas is a gas capable of dissolving a compound produced during the reaction treatment.

3. The treatment apparatus according to claim 1, wherein said cleaning gas is an inert gas.

4. The treatment apparatus according to claim 1, wherein said reaction vessel is formed of a cylindrical reaction tube.

5. The treatment apparatus according to claim 4, wherein said division means is formed of an inner tube having a capped end portion and disposed in the reaction tube so as to be coaxial therewith.

6. The treatment apparatus according to claim 5, wherein said communication means is formed of a number of perforations bored through the wall of the inner tube.

7. The treatment apparatus according to claim 5, wherein said reaction tube has a vertical longitudinal axis, and said cleaning gas supply means and said exhaust means are connected to the top and bottom portions, respectively, of the reaction tube.

8. The treatment apparatus according to claim 4, wherein said division means is formed of a first inner tube having an open end portion and disposed in the reaction tube so as to be coaxial therewith.

9. The treatment apparatus according to claim 8, wherein said communication means is formed of an end opening of the inner tube.

10. The treatment apparatus according to claim 8, wherein a second inner tube having an open end portion is disposed between said reaction tube and said first inner tube so as to be coaxial therewith.

11. The treatment apparatus according to claim 10, wherein said cleaning gas supply means is connected to a gap between the first and second inner tubes, and said exhaust means is connected to a gap between the second inner tube and the reaction tube.

* * * * *